United States Patent
Jin

(10) Patent No.: US 12,376,287 B2
(45) Date of Patent: Jul. 29, 2025

(54) BIT LINE STRUCTURE, SEMICONDUCTOR STRUCTURE AND METHOD OF MANUFACTURING BIT LINE STRUCTURE

(71) Applicant: CHANGXIN MEMORY TECHNOLOGIES, INC., Hefei (CN)

(72) Inventor: Xing Jin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 425 days.

(21) Appl. No.: 18/150,899

(22) Filed: Jan. 6, 2023

(65) Prior Publication Data
US 2023/0148354 A1 May 11, 2023

Related U.S. Application Data

(63) Continuation of application No. PCT/CN2022/071821, filed on Jan. 13, 2022.

(30) Foreign Application Priority Data

Jul. 26, 2021 (CN) .......................... 202110844690.9

(51) Int. Cl.
H10B 12/00 (2023.01)
(52) U.S. Cl.
CPC .......... *H10B 12/482* (2023.02); *H10B 12/02* (2023.02); *H10B 12/485* (2023.02)
(58) Field of Classification Search
CPC ............................. H10B 12/482; H10B 12/485
See application file for complete search history.

(56) References Cited

U.S. PATENT DOCUMENTS

| 6,927,072 | B2 | 8/2005 | Molla et al. | |
| 8,697,525 | B2 * | 4/2014 | Kim | H10B 12/482 |
| | | | | 438/294 |
| 9,530,849 | B2 * | 12/2016 | Oh | H01L 21/28008 |
| 9,608,106 | B2 | 3/2017 | Jang et al. | |
| 2008/0227290 | A1 | 9/2008 | Bae | |
| 2015/0214313 | A1 * | 7/2015 | Oh | H10D 30/62 |
| | | | | 438/270 |
| 2022/0122990 | A1 * | 4/2022 | Liu | H10B 12/34 |

(Continued)

FOREIGN PATENT DOCUMENTS

| CN | 1781156 A | 5/2006 |
| CN | 100561349 C | 11/2009 |
| CN | 102543880 A | 7/2012 |

(Continued)

OTHER PUBLICATIONS

International Search Report cited in PCT/CN2022/071821 mailed Apr. 26, 2022, 10 pages.

*Primary Examiner* — Steven M Page
(74) *Attorney, Agent, or Firm* — Kilpatrick Townsend & Stockton LLP

(57) ABSTRACT

The present disclosure provides a bit line (BL) structure, a semiconductor structure and a method of manufacturing the BL structure. The BL structure is provided on a substrate, and includes: a contact portion, including a bottom surface connected to the substrate; a barrier layer, including an extension portion, the extension portion covering a top surface and an outer sidewall surface of the contact portion; and a conductive layer, covering a part of the barrier layer.

10 Claims, 17 Drawing Sheets

(56) References Cited

U.S. PATENT DOCUMENTS

2022/0139925 A1\* 5/2022 Su .................... H10B 12/485
                                                    257/296

FOREIGN PATENT DOCUMENTS

| CN | 102543944 A | 7/2012 |
| CN | 104810390 A | 7/2015 |
| CN | 112992775 A | 6/2021 |
| CN | 113571521 A | 10/2021 |

\* cited by examiner

BIT LINE STRUCTURE, SEMICONDUCTOR STRUCTURE AND METHOD OF MANUFACTURING BIT LINE STRUCTURE

CROSS-REFERENCE TO RELATED APPLICATIONS

This is a continuation of International Application No. PCT/CN2022/071821, filed on Jan. 13, 2022, which claims the priority to Chinese Patent Application 202110844690.9, titled "BIT LINE STRUCTURE, SEMICONDUCTOR STRUCTURE AND METHOD OF MANUFACTURING BIT LINE STRUCTURE" and filed on Jul. 26, 2021. The entire contents of International Application No. PCT/CN2022/071821 and Chinese Patent Application 202110844690.9 are incorporated herein by reference.

TECHNICAL FIELD

The present disclosure relates, but is not limited to, a bit line structure, a semiconductor structure and a method of manufacturing a bit line structure.

BACKGROUND

In a dynamic random access memory (DRAM) device, a bit line (BL) is connected to a transistor and a capacitor. During manufacture of the DRAM, polysilicon (referred to as poly) is deposited necessarily to form contact and conductive structures of the BL. The contact resistance of the BL determines an electrical conductivity of the BL and a magnitude of current of the device, thereby affecting a conductivity of the device. With miniaturization of integrated circuits (ICs), increasingly higher requirements are being put forward for the contact and conductive structures of the BL.

SUMMARY

An overview of the subject described in detail in the present disclosure is provided below. This overview is not intended to limit the protection scope of the claims.

The present disclosure provides a bit line structure, a semiconductor structure and a method of manufacturing a bit line structure.

A first aspect of the present disclosure provides a bit line structure, the bit line structure is provided on a substrate, and includes:

a contact portion, including a bottom surface connected to the substrate;

a barrier layer, including an extension portion, the extension portion covering a top surface and an outer sidewall surface of the contact portion; and a conductive layer, covering a part of the barrier layer.

A second aspect of the present disclosure provides a semiconductor structure including the bit line structure of the present disclosure.

A third aspect of the present disclosure provides a method of manufacturing a bit line structure, including:

providing a base, the base including a substrate and a first initial dielectric layer covering the substrate;

forming an initial contact hole in the base, a bottom wall of the initial contact hole exposing the substrate, and the initial contact hole penetrating through the first initial dielectric layer;

forming, in the initial contact hole, a contact portion and a second initial dielectric unit covering an outer sidewall of the contact portion, a bottom surface of the contact portion being connected to the substrate, and a sidewall of the second initial dielectric unit being connected to the substrate and the first initial dielectric layer;

etching a part of the first initial dielectric layer, and forming a first dielectric layer, the first dielectric layer exposing a part of the sidewall of the second initial dielectric unit;

depositing a third initial dielectric layer and an initial laminated structure, wherein the third initial dielectric layer covers the first dielectric layer and the part of the sidewall of the second initial dielectric unit, as well as a top surface of the contact portion and a top surface of the second initial dielectric unit, the third initial dielectric layer and the second initial dielectric unit are connected as a whole, and the initial laminated structure covers the third initial dielectric layer;

etching the initial laminated structure, the third initial dielectric layer and the second initial dielectric unit, wherein a remaining part of the initial laminated structure forms a laminated structure; the laminated structure includes a conductive layer; a remaining part of the second initial dielectric unit and a remaining part of the third initial dielectric layer are connected as a whole and form a barrier layer; and a part of the remaining part of the second initial dielectric unit and a part of a remaining part of the third initial dielectric layer that cover the contact portion form an extension portion of the barrier layer; and forming a fourth dielectric layer, the fourth dielectric layer covering the laminated structure and a part of the extension portion.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

REFERENCE NUMERALS

10: photoresist mask layer, 11: first pattern, 110: substrate, 101: initial contact hole, 102: contact hole, 111: active region, 120: first initial dielectric layer, 121: first dielectric layer, 130: second initial dielectric unit, 131: second initial dielectric layer, 140: third initial dielectric layer, 150: contact dielectric layer, 160: initial conductive layer, 170: initial isolation layer, 180: mask layer, 190: fourth dielectric layer, 200: BL structure, 210: contact portion, 211: first part, 212: second part, 220: barrier layer, 221: extension portion, 2211: first outer sidewall part, 2212: second outer sidewall part, 222: main body portion, 230: conductive layer, 240: isolation layer, 300: insulating structure, 310: insulating portion, 400: WL, 500: initial laminated structure, and 600: laminated structure; and 110': substrate, 120': insulating layer, 200': BL structure, 210': contact portion, 220': barrier metal layer, 230': conductive layer, 240': isolation layer, and 300': insulating structure.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A contact portion of a BL structure is connected to a transistor and a capacitor through a conductive layer. A resistance of the contact portion has a largest impact on an electrical conductivity of the BL. In order to minimize the contact resistance of the BL, a barrier metal layer of a highly refractory metal or metal compound such as titanium nitride is further provided on a top surface of the contact portion.

Figure 24:
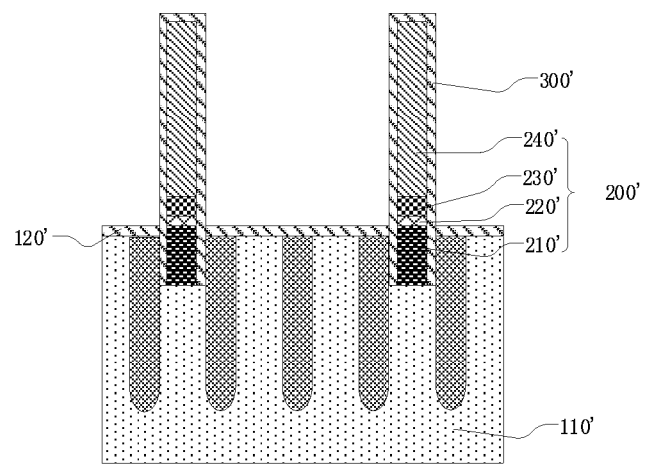
FIG. 24 is a sectional view of a BL structure in a direction parallel to a WL' according to an exemplary comparative embodiment.
Figure 25:
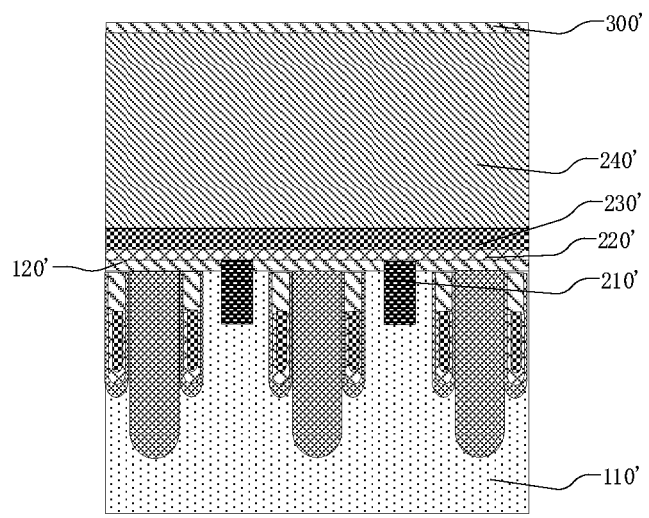
FIG. 25 is a sectional view of a BL structure in a direction of a BL' according to an exemplary comparative embodiment.
Figure 26:
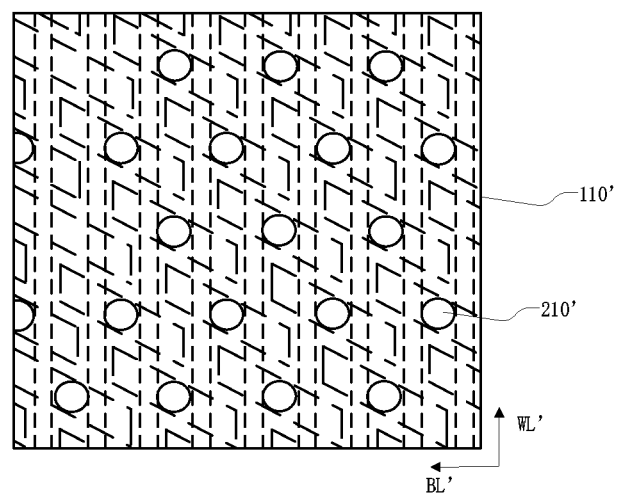
FIG. 26 illustrates projection of a contact portion of a BL structure on a substrate according to an exemplary comparative embodiment.

As shown in FIGS. 24-26, referring to an orientation in FIG. 26, FIG. 24 is a sectional view of a BL structure in a direction parallel to a WL (namely the direction of the WL' in FIG. 26). FIG. 25 is a sectional view of a BL structure in a direction of a BL (namely the direction of the BL' in FIG. 26). FIG. 26 illustrates projection of a contact portion 210' of a BL structure on a substrate 110'. In the related art, a BL structure 200' is provided in a substrate 110'. The BL structure includes a contact portion 210', a barrier metal layer 220', a conductive layer 230', and an isolation layer 240'. The contact portion 210' is provided in the substrate 110'. The contact portion 210' includes a bottom surface connected to the substrate 110', and a top flush with an insulating layer 120' on the substrate 110'. The barrier metal layer 220' covers the top surface of the contact portion 210'. The conductive layer 230' is located on the substrate 110' and covers the barrier metal layer 220'. The isolation layer 240' covers the conductive layer 230'. The BL structure 200' is covered by an insulating structure 300'.

The top surface of the contact portion 210' is electrically connected to the conductive layer 230' through the barrier metal layer 220'. A contact area between the contact portion 210' and the conductive layer 230' is an area of the top surface of the contact portion 210'. However, during manufacture of the BL structure 200', when an insulating portion is formed on a sidewall of the contact portion 210', the sidewall of the contact portion 210' is prone to oxidation to is increase a resistance of the contact portion 210'.

Moreover, while ICs are developed toward a higher level of integration and a higher density, there are smaller sizes of the ICs, smaller spacings between WLs in the ICs, smaller sizes of BLs, and smaller contact areas of contact portions. As a result, resistances of the BLs may be increased greatly.

Figure 1:
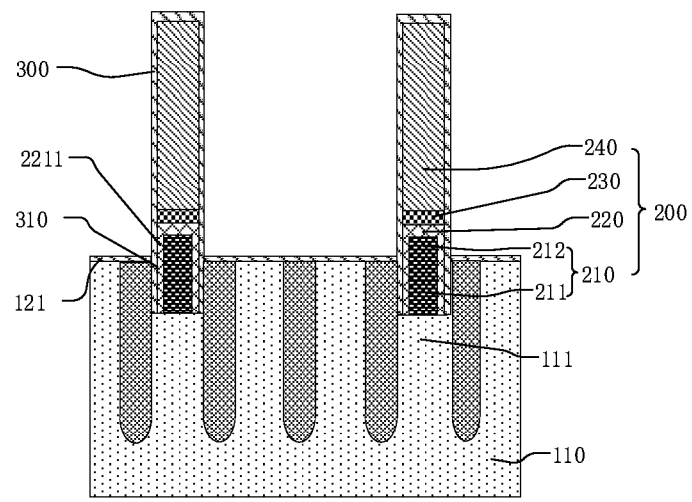
FIG. 1 is a sectional view of a bit line (BL) structure in a direction parallel to a word line (WL) according to an exemplary embodiment of the present disclosure.
Figure 2:
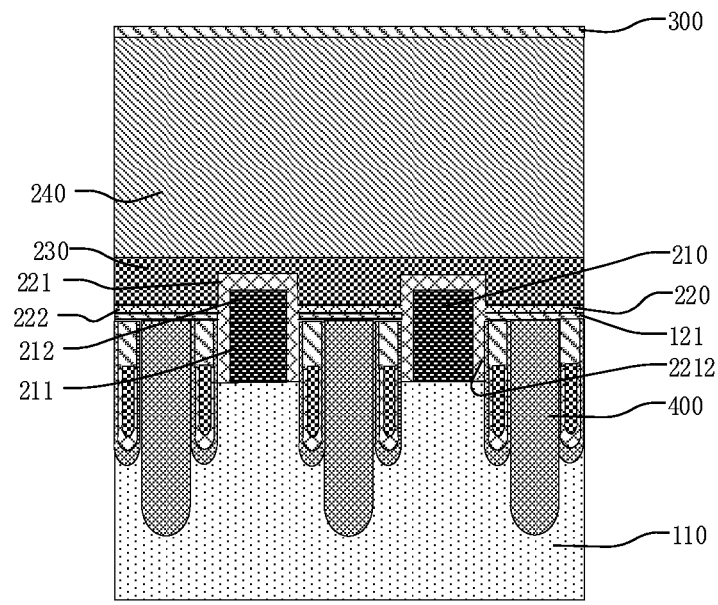
FIG. 2 is a sectional view of a BL structure in a direction of a BL according to an exemplary embodiment of the present disclosure.
Figure 3:
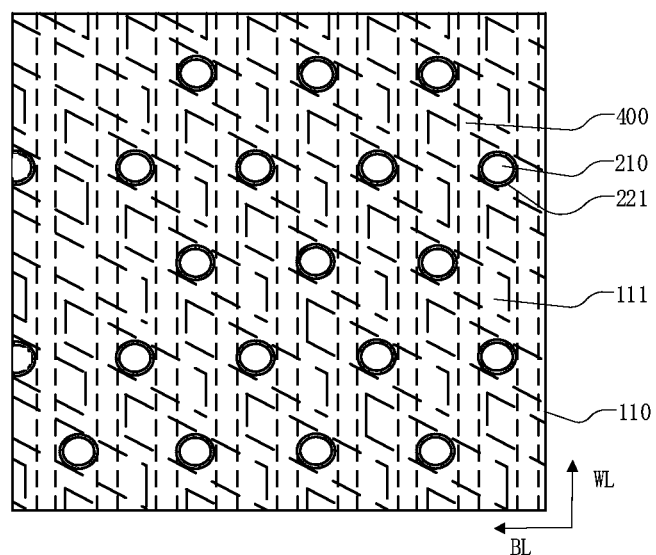
FIG. 3 illustrates projection of a contact portion of a BL structure on a substrate according to an exemplary embodiment.

As shown in FIGS. 1-3, an exemplary embodiment of the present disclosure provides a BL structure, which is provided in a substrate 110. FIG. 1 is a sectional view of the BL structure in a direction parallel to a WL in FIG. 3 (namely an extension direction of the WL) according to the embodiment. FIG. 2 is a sectional view of the BL structure in a direction of a BL in FIG. 3 (namely an extension direction of the BL structure) according to the embodiment. FIG. 3 illustrates projection of a contact portion 210 of the BL structure on the substrate 110 according to the embodiment.

As shown in FIG. 1 and FIG. 2, the BL structure 200 includes: a contact portion 210 including a bottom surface connected to the substrate 110, a barrier layer 220 covering a part of the contact portion 210, and a conductive layer 230 covering a part of the barrier layer 220. The barrier layer 220 includes an extension portion 221 covering a top surface and an outer sidewall surface of the contact portion 210.

As shown in FIG. 3, the substrate 110 includes active regions 111 arranged in an array. The bottom surface of the contact portion 210 contacts and is connected to each of the active regions 111 in the substrate. The substrate 110 is a semiconductor substrate including a silicon-containing substance. For example, the semiconductor substrate may be a silicon substrate, a silicon-germanium substrate, or a silicon on insulator (SOI) substrate. The contact portion 210 includes poly.

The barrier layer 220 may be of a single-layer structure or a laminated structure. The barrier layer 220 includes one or more selected from the group consisting of conductive metal, conductive metal nitride, and conductive alloy. For example, the conductive metal may be titanium, tantalum, or tungsten.

The conductive layer 230 may be of a single-layer structure or a laminated structure. The conductive layer 230 includes one or more selected from the group consisting of conductive metal, conductive metal nitride, and conductive alloy. For example, the conductive metal may be titanium, tantalum, or tungsten.

As shown in FIG. 1, FIG. 2 and FIG. 3, as the barrier layer 220 covers the top and the outer sidewall of the contact portion 210, the BL structure 200 in the embodiment prevents the top and the outer sidewall of the contact portion 210 from being oxidized in manufacture of the BL to increase the contact resistance. The BL structure in the embodiment reduces the contact resistance of the contact portion 210 to achieve better electrical performance.

According to an exemplary embodiment, most contents of the BL structure in the embodiment are the same as those in the foregoing embodiment. The embodiment differs from the foregoing embodiment in: As shown in FIG. 1 and FIG. 2, the contact portion 210 includes a first part 211 and a second part 212. The first part 211 is located in the substrate 110. The second part 212 is located on the substrate 110. The barrier layer 220 further includes a main body portion 222. The second part 212 of the contact portion 210 penetrates through the main body portion 222 and extends into the conductive layer 230. The conductive layer 230 covers the main body portion 222 of the barrier layer 220 and a part of a surface of the extension portion 221.

Improvements are made to the BL structure in the embodiment. The first part 211 of the contact portion 210 is buried in the substrate 110. The second part 212 of the contact portion 210 extends out of the substrate 110 and extends into the conductive layer 230. A contact area between the contact portion 210 and the conductive layer 230 is a sum of an area of the top surface of the contact portion 210 and an area of a sidewall of the second part 212 of the contact portion 210 extending into the conductive layer 230. Therefore, the contact area between the contact portion 210 and the conductive layer 230 is increased.

By increasing the contact area between the contact portion 210 and the conductive layer 230 in the embodiment, the contact resistance between the contact portion 210 and the conductive layer 230 is reduced. With higher electrical connection performance between the contact portion 210 and the conductive layer 230 in the BL, the current is conducted more rapidly, and thus the electrical performance of the device can be improved.

According to an exemplary embodiment, most contents of the BL structure in the embodiment are the same as those in the foregoing embodiment. The embodiment differs from the foregoing embodiment in: As shown in FIG. 1 and FIG. 2, the main body portion 222 covers a first dielectric layer 121 on the substrate 110. The second part 112 of the contact portion 210 penetrates through the first dielectric layer 121.

Exemplarily, a material of the first dielectric layer 121 may include a material with desirable insulation performance such as silicon nitride or silicon oxynitride. The first dielectric layer 121 covers a surface of the substrate 110 to insulate and isolate a structure in the substrate 110.

According to an exemplary embodiment, most contents of the BL structure in the embodiment are the same as those in the foregoing embodiment. The embodiment differs from the foregoing embodiment in: As shown in FIG. 1 and FIG. 2, along a circumferential direction of the extension portion 221, a first outer sidewall part 2211 of the extension portion 221 contacts and is connected to the substrate 110, and a second outer sidewall part 2212 of the extension portion 221 is provided with an insulating portion 310.

Along the circumferential direction of the extension portion 221, the first outer sidewall part 2211 of the extension portion 221 is the extension portion 221 in a first circumferential direction of the contact portion 210, and the second outer sidewall part 2212 of the extension portion 221 is the extension portion 221 in a second circumferential direction of the contact portion 210. The second direction refers to the extension direction of the BL structure 200 (namely the direction of the BL in FIG. 3).

By providing the insulating portion 310 to cover the second outer sidewall is part 2212 of the extension portion 221, the contact portion 210 in the extension portion 221 is protected well. In the embodiment, the insulating portion 310 and the first dielectric layer 121 on the surface of the substrate are connected as a whole to better protect the second outer sidewall part 2212 of the extension portion 221.

According to an exemplary embodiment, most contents of the BL structure in the embodiment are the same as those in the foregoing embodiment. As shown in FIG. 3, according to the BL structure 200 in the embodiment, a plurality of parallel WLs 400 are buried in the substrate 110. The contact portion 210 is provided between adjacent ones of the WLs 400.

As shown in FIG. 3, the WLs 400 are buried WLs. The WLs 400 are buried in the substrate 110. The WLs 400 are intersected with the active regions 111. A top of each of the WLs 400 is not higher than the surface of the substrate 110. In the embodiment, the active regions 111 in the substrate 110 are arranged in an array. The plurality of WLs 400 in the substrate 110 are also arranged parallel in an array. Each of the WLs 400 is intersected with at least one of the active regions 111.

The contact portion 210 is provided in the substrate 110 between the adjacent ones of the WLs 400. The bottom surface of the contact portion 210 contacts and is connected to the active region 111, such that a limited space of the substrate 110 is fully utilized.

In some embodiments of the present disclosure, projection of the extension portion 221 on the substrate 110 is of a square. With a plane parallel to the WLs 400 and perpendicular to the substrate 110 as a first section, the second outer sidewall part 2212 of the extension portion 221 and the first section are perpendicular to each other.

In the embodiment, the second outer sidewall part 2212 of the extension portion 221 and the first section are perpendicular to each other. The direction of the second outer sidewall part 2212 of the extension portion 221 refers to the extension direction of the BL structure 200 (namely the direction of the BL in is FIG. 3). The extension direction of the BL 200 (namely the direction of the BL in FIG. 3) is perpendicular to the extension direction of the WL 400 (namely the direction of the WL in FIG. 3).

The projection of the extension portion 221 on the substrate 110 is of the square, namely the first direction in which the first outer sidewall part 2211 of the extension portion 221 is located is perpendicular to the second direction. In the embodiment, the first direction refers to the direction of the WL in FIG. 3.

In the embodiment, the limited space of the substrate 110 is fully utilized to provide more BL structures 200 and WLs 400.

According to an exemplary embodiment, most contents of the BL structure 200 in the embodiment are the same as those in the foregoing embodiment. The embodiment differs from the foregoing embodiment in: As shown in FIG. 1 and FIG. 2, a thickness of the first outer sidewall part 2211 of the extension portion 221 is greater than a thickness of the second outer sidewall part 2212 of the extension portion 221.

In the foregoing embodiment, the projection of the extension portion 221 on the substrate 110 is of the square. The second direction in which the second outer sidewall part 2212 of the extension portion 221 is located refers to the extension direction of the BL structure 200 (namely the direction of the BL in FIG. 3). The first direction in which the first outer sidewall part 2211 of the extension portion 221 is located is parallel to the extension direction of the WL 400 (namely the direction of the WL in FIG. 3).

In the embodiment, the linear shape of the BL structure 200 is kept by thinning the second outer sidewall part 2212 of the extension portion 221.

According to an exemplary embodiment, as shown in FIGS. 1-3, the BL structure 200 in the embodiment is provided in a substrate 110. A first dielectric layer 121 covers the substrate 110. Arrayed active regions 111 are arranged in the substrate 110. The BL structure 200 includes: a contact portion 210 including a bottom contacting and connected to each of the active regions 111, a barrier layer 220 covering a part of the contact portion 210, a conductive layer 230 covering a part of the barrier layer 220, and an isolation layer 240 covering a top of the conductive layer 230.

A material of the isolation layer 240 may include a material with desirable insulation performance such as silicon nitride or silicon oxynitride. The isolation layer 240 covers the conductive layer 230 to protect the BL structure 200.

As shown in FIG. 1 and FIG. 2, the contact portion 210 includes a first part 211 buried in the substrate 110 and a second part 212 extending out of the substrate 110. The barrier layer 220 includes an extension portion 221 covering a sidewall and a top surface of the contact portion 210, and a main body portion 222 covering the first dielectric layer 121. The second part 212 of the contact portion 210 penetrates through the main body portion 222 and extends into the conductive layer 230. The extension portion 221 covering a sidewall of the first part 211 of the contact portion 210 is also buried in the substrate 110. The extension portion 221 covering a sidewall of the second part 212 of the contact portion 210 and the second part 212 of the contact portion 210 extend into the conductive layer 230 together. The conductive layer 230 covers the main body portion 222 of the barrier layer 220 and extends into a surface of the extension portion 221 in the conductive layer 230.

In the embodiment, the BL structure 200 is further covered by an insulating structure 300. The insulating structure 300 covers two sidewalls of the BL structure 200 on the substrate 110, a top of the isolation layer 240, and a second outer sidewall part 2212 of the contact portion in the substrate 110.

According to the BL structure 200 in the embodiment, by increasing the contact area between the contact portion 210 and the conductive layer 230, the contact resistance between the contact portion 210 and the conductive layer 230 is reduced. With higher electrical connection performance between the contact portion 210 and the conductive layer 230, the current of the BL structure is conducted more rapidly in an IC, and thus the electrical performance of the device is improved. Moreover, the BL structure in the embodiment is further protected by the isolation layer 240 and the insulating structure 300, such that the BL structure is firmer and more stable.

An exemplary embodiment of the present disclosure provides a semiconductor structure. The semiconductor structure includes the BL structure 200 in the foregoing embodiment of the present disclosure.

The semiconductor structure according to the embodiment of the present disclosure may be included in a memory cell and a memory cell array. A read operation or a write operation is performed through the BL structure 200 in the embodiment of the present disclosure. According to the semiconductor structure in the embodiment of the present disclosure, the contact portion of the BL structure has a small contact resistance, such that the current is conducted more rapidly, the data reading and writing speeds of the semiconductor structure are faster, and both electrical performance and memory performance of the semiconductor structure are improved.

The memory cell and the memory cell array may be included in a memory device and the memory device may be used in a dynamic random access memory (DRAM). However, the memory device may alternatively be applied in a static random-access memory (SRAM), a flash memory (flash EPROM), a ferroelectric random-access memory (FeRAM), a magnetic random access memory (MRAM), a phase change random-access memory (PRAM), or the like.

Figure 4:
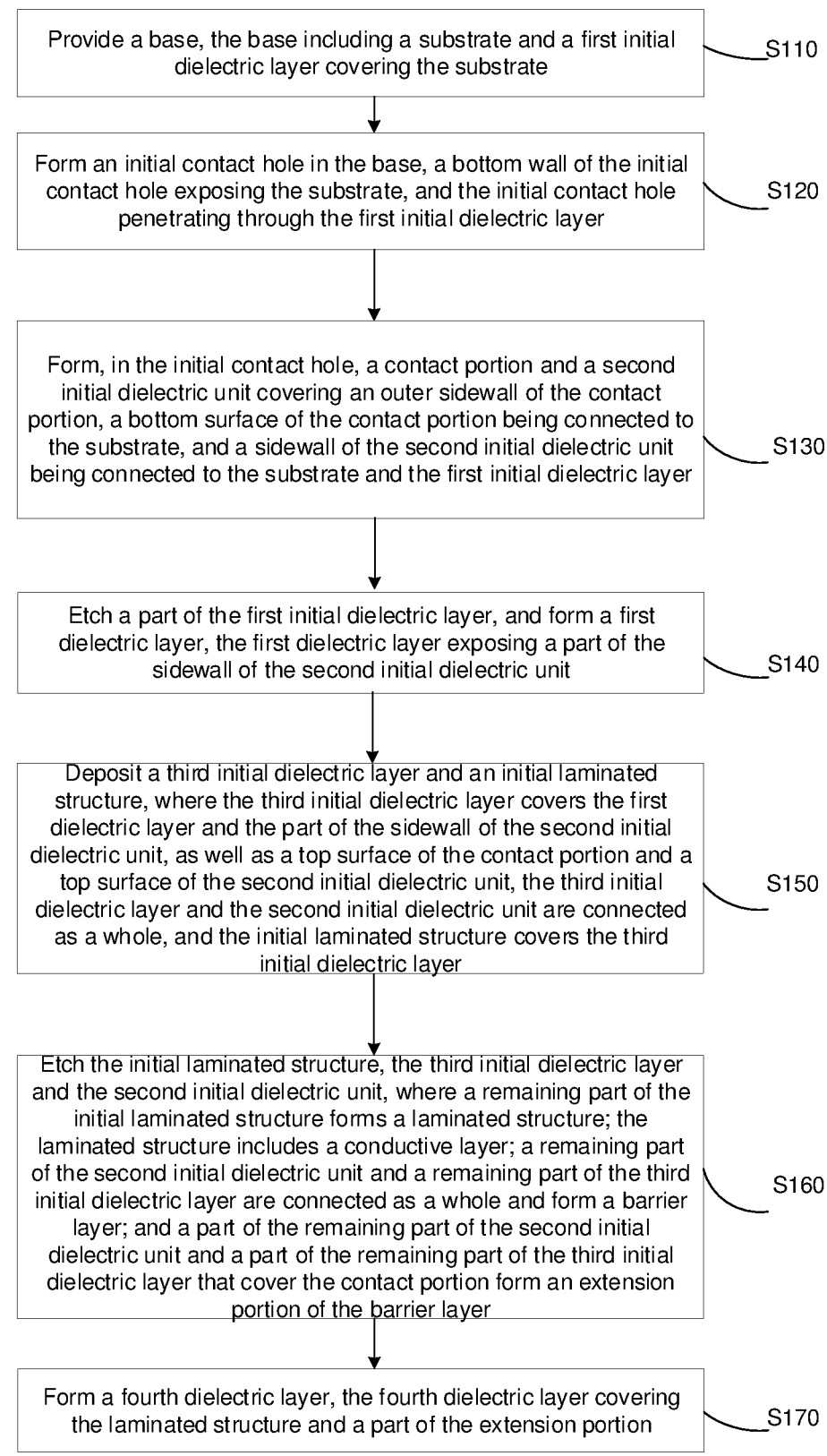
FIG. 4 is a flowchart of a method of manufacturing a BL structure according to an exemplary embodiment.

An exemplary embodiment of the present disclosure provides a method of manufacturing a BL structure, as shown in FIG. 4. FIG. 4 is a flowchart of a method of manufacturing a BL structure according to an exemplary embodiment of the present disclosure. FIG. 10A to FIG. 23B are schematic views of various stages in the method of manufacturing a BL structure. The method of manufacturing a BL structure is described below with reference to FIG. 10A to FIG. 23B.

As shown in FIG. 4, the method of manufacturing a BL structure provided by the exemplary embodiment of the present disclosure includes:

S110: Provide a base, the base including a substrate and a first initial dielectric layer covering the substrate.

Figure 10A:
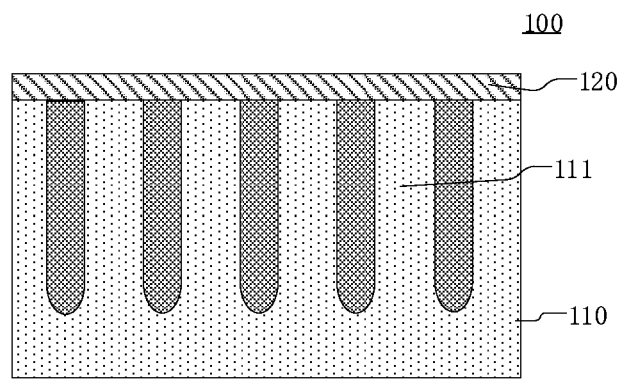
FIG. 10A is a sectional view of a base in a direction parallel to a WL according to an exemplary embodiment.
Figure 10B:
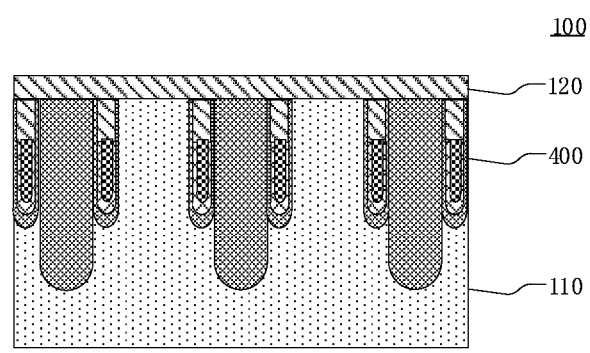
FIG. 10B is a sectional view of a base in a direction of a BL according to an exemplary embodiment.

FIG. 10A is a sectional view of the base in a direction parallel to a WL (referring to FIG. 3) according to the embodiment. FIG. 10B is a sectional view of the base in a direction of a BL (referring to FIG. 3) according to the embodiment. As shown in FIG. 10A and FIG. 10B, when the base 100 is provided, the substrate 110 is provided first and then the first initial dielectric layer 120 is deposited on the substrate 110. The first initial dielectric layer 120 covers a top of the substrate 110 to form the base 100.

The substrate 110 is a semiconductor substrate including a silicon-containing substance. For example, the semiconductor substrate may be a silicon substrate, a silicon-germanium substrate, or an SOI substrate. The substrate 110 includes active regions 111 arranged in an array (referring to FIG. 3). As shown in FIG. 10A and FIG. 10B, a plurality of parallel WLs 400 are further arranged in the substrate 100 (referring to FIG. 3). The WLs 400 are buried WLs, and are buried in the substrate 100. The WLs 400 extend along a first direction (referring to the direction of the WL in FIG. 3). The WLs 400 are respectively intersected with the active regions 111 at a predetermined angle, rather than perpendicular to the active regions (referring to FIG. 3).

A material of the first initial dielectric layer 120 includes a material with desirable insulation performance such as silicon nitride or silicon oxynitride. In the embodiment, the first initial dielectric layer 120 is made of silicon nitride.

S120: Form an initial contact hole in the base, a bottom wall of the initial contact hole exposing the substrate, and the initial contact hole penetrating through the first initial dielectric layer.

Figure 11A:
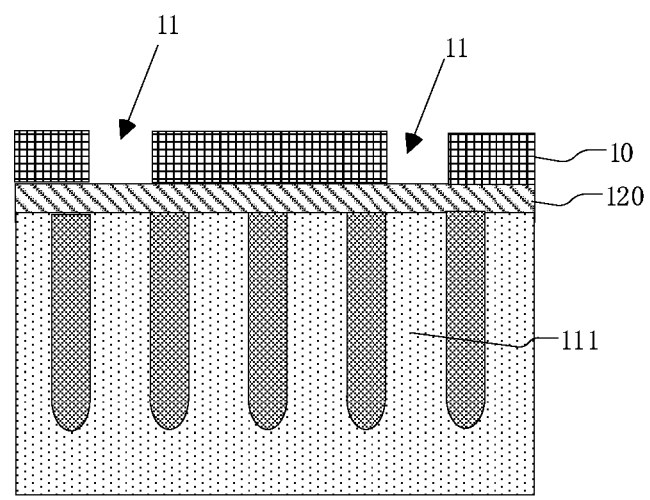
FIG. 11A is a sectional view of a photoresist mask layer formed in a direction parallel to a WL according to an exemplary embodiment.
Figure 11B:
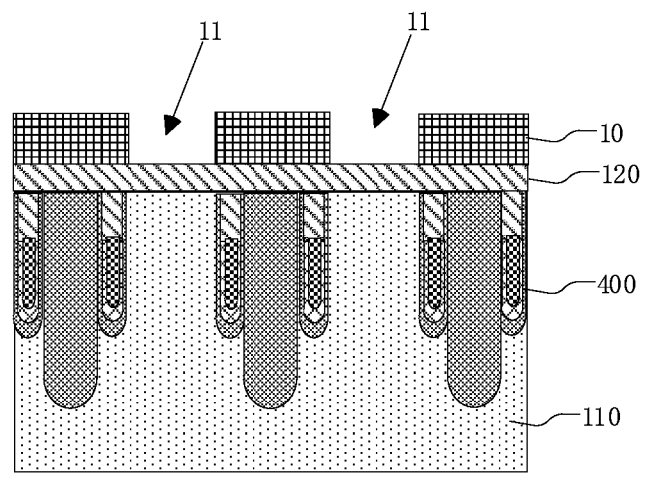
FIG. 11B is a sectional view of a photoresist mask layer formed in a direction of a BL according to an exemplary embodiment.
Figure 12A:
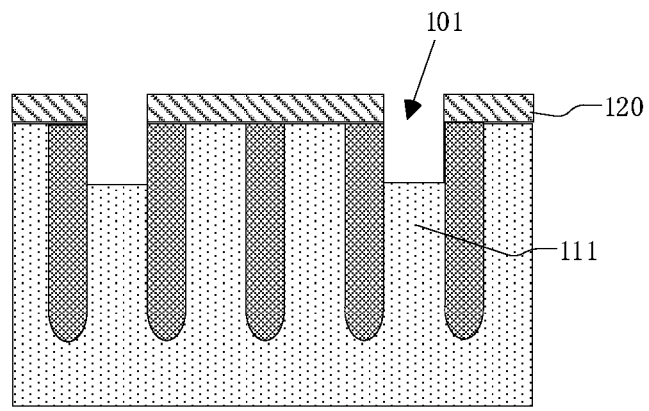
FIG. 12A is a sectional view of an initial contact hole formed in a direction parallel to a WL according to an exemplary embodiment.
Figure 12B:
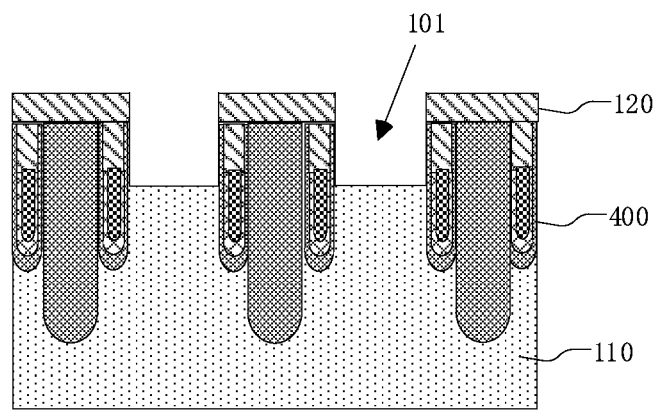
FIG. 12B is a sectional view of an initial contact hole formed in a base in a direction of a BL according to an exemplary embodiment.

FIG. 11A is a sectional view of a photoresist mask layer formed in a direction parallel to a WL (referring to FIG. 3) according to the embodiment. FIG. 11B is a sectional view of a photoresist mask layer formed in a direction of a BL (referring to FIG. 3) according to the embodiment. FIG. 12A is a sectional view of the initial contact hole formed in a direction parallel to a WL (referring to FIG. 3) according to the embodiment. FIG. 12B is a sectional view of the initial contact hole formed in a direction of a BL (referring to FIG. 3) according to the is embodiment.

As shown in FIG. 12A and FIG. 12B, referring to FIG. 11A and FIG. 11B, the photoresist mask layer 10 is formed on the first initial dielectric layer 120. A first pattern 11 is defined on the photoresist mask layer 10. Projection of the first pattern 11 on the substrate 100 falls between adjacent two of the WLs 400. There is an overlapping region between the projection of the first pattern 11 on the substrate 100 and projection of the active region 111 (referring to FIG. 3) on the substrate 100. According to the first pattern 11, the first initial dielectric layer 120 and a part of the substrate 110 are removed sequentially to expose the active region 111, thereby forming the initial contact hole 101.

S130: Form, in the initial contact hole, a contact portion and a second initial dielectric unit covering an outer sidewall of the contact portion, a bottom surface of the contact portion being connected to the substrate, and a sidewall of the second initial dielectric unit being connected to the substrate and the first initial dielectric layer.

Figure 14A:
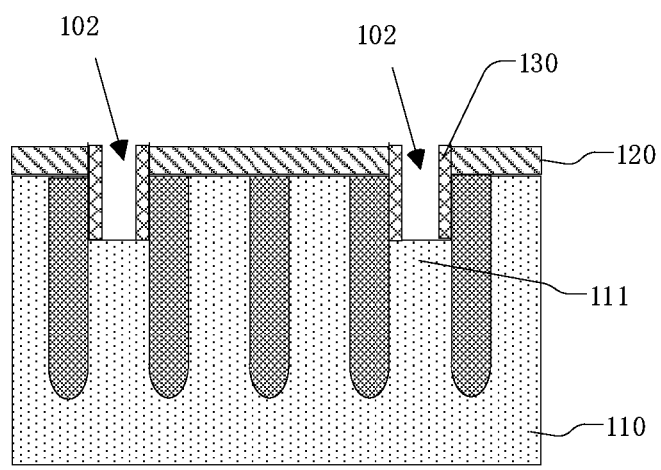
FIG. 14A is a sectional view of a second initial dielectric unit formed in a direction parallel to a WL according to an exemplary embodiment.
Figure 14B:
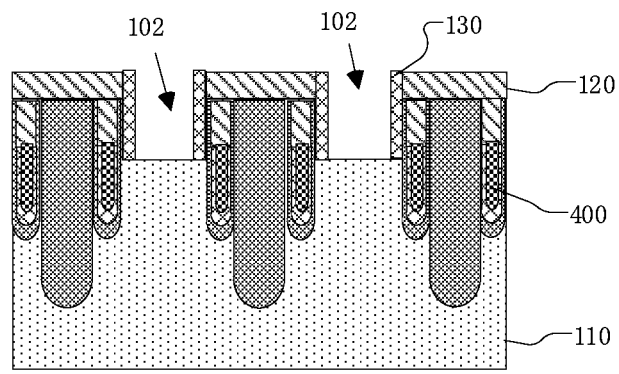
FIG. 14B is a sectional view of a second initial dielectric unit formed in a direction of a BL according to an exemplary embodiment.

FIG. 14A is a sectional view of the second initial dielectric unit formed in a direction parallel to a WL (referring to FIG. 3) according to the embodiment. FIG. 14B is a sectional view of the second initial dielectric unit formed in a direction of a BL (referring to FIG. 3) according to the embodiment. As shown in FIG. 14A and FIG. 14B, the second initial dielectric unit 130 is formed in the initial contact hole 101. The second initial dielectric unit 130 covers a sidewall of the initial contact hole 101.

Figure 16A:
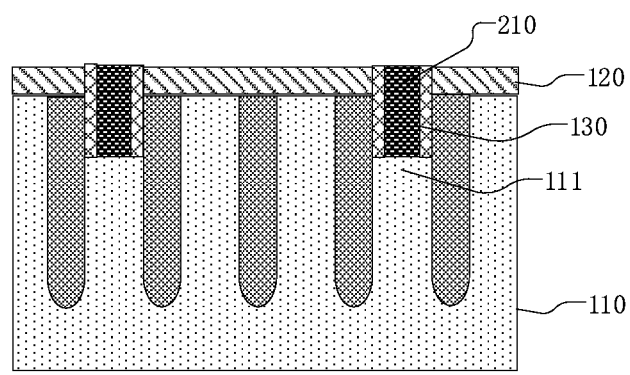
FIG. 16A is a sectional view of a contact portion formed in a direction is parallel to a WL according to an exemplary embodiment.
Figure 16B:
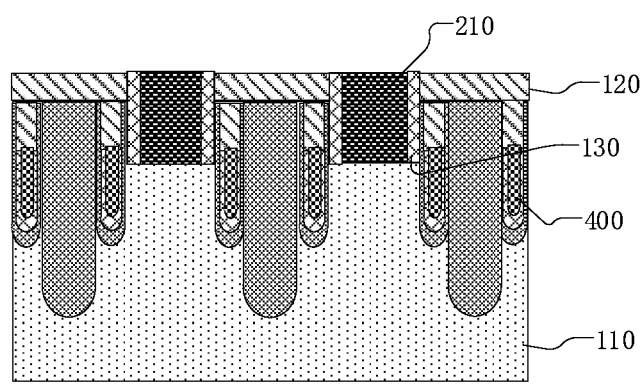
FIG. 16B is a sectional view of a contact portion formed in a direction of a BL according to an exemplary embodiment.

FIG. 16A is a sectional view of the contact portion formed in a second direction, namely a direction parallel to a WL in FIG. 3 (referring to FIG. 3), according to the embodiment. FIG. 16B is a sectional view of the contact portion formed in a direction of a BL (referring to FIG. 3) according to the embodiment. As shown in FIG. 16A and FIG. 16B, the second initial dielectric unit 130 is filled to form the contact portion 210. The bottom surface of the contact portion 210 is in contact with the substrate 110. A top of each of the second initial dielectric unit and the contact portion 210 is flush with a top surface of the first initial is dielectric layer 120. The outer sidewall of the contact portion 210 is covered by the second initial dielectric unit 130.

The second initial dielectric unit 130 may be deposited by atomic layer deposition (ALD). A material of the second initial dielectric unit 130 includes one or more selected from the group consisting of conductive metal, conductive metal nitride, and conductive alloy. For example, the conductive metal may be titanium, tantalum, or tungsten. In the embodiment, the second initial dielectric unit 130 is made of titanium nitride.

The contact portion 210 may be deposited by the ALD. The contact portion 210 may be made of poly.

S140: Etch a part of the first initial dielectric layer, and form a first dielectric layer, the first dielectric layer exposing a part of the sidewall of the second initial dielectric unit.

Figure 17A:
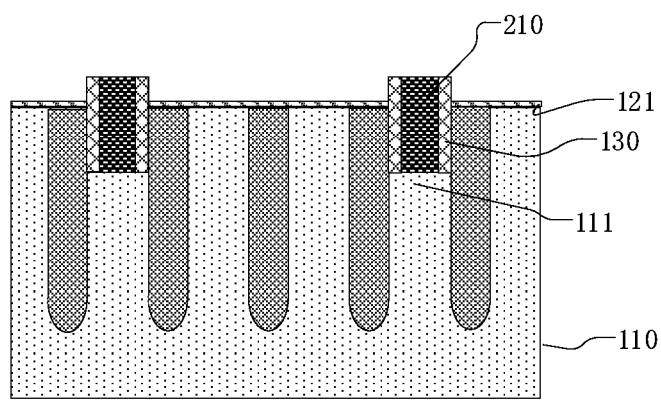
FIG. 17A is a sectional view of a first dielectric layer formed in a direction parallel to a WL according to an exemplary embodiment.
Figure 17B:
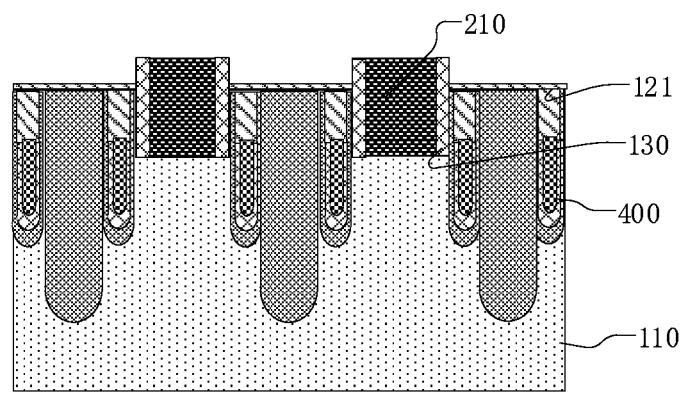
FIG. 17B is a sectional view of a first dielectric layer formed in a direction of a BL according to an exemplary embodiment.

FIG. 17A is a sectional view of the first dielectric layer formed in a direction parallel to a WL (referring to FIG. 3) according to the embodiment. FIG. 17B is a sectional view of the first dielectric layer formed in a direction of a BL (referring to FIG. 3) according to the embodiment. As shown in FIG. 17A and FIG. 17B, referring to FIG. 16A and FIG. 16B, the first initial dielectric layer 120 may be re-etched for a predetermined thickness by dry etching or wet drying to form the first dielectric layer 121. The first dielectric layer 121 is thinner than the first initial dielectric layer 120 by the predetermined thickness. The top surface of the contact portion 210 originally flush with the top surface of the first initial dielectric layer 120 forms a protrusive portion protruding from the top of the first dielectric layer 121 by a predetermined height, and the second initial dielectric unit 130 on a sidewall of the protrusive portion is exposed.

S150: Deposit a third initial dielectric layer and an initial laminated structure, where the third initial dielectric layer covers the first dielectric layer and the part of the sidewall of the second initial dielectric unit, as well as a top surface of the contact portion and a top surface of the second initial dielectric unit, the third initial dielectric layer and the second initial dielectric unit are connected as a whole, and the initial laminated structure covers the third initial dielectric layer.

Figure 18A:
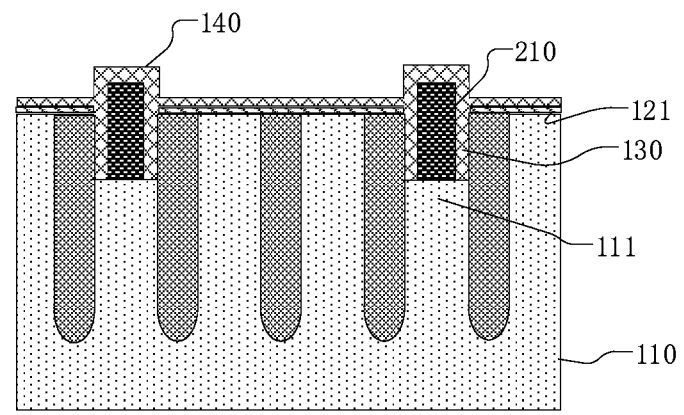
FIG. 18A is a sectional view of a third initial dielectric layer formed in a direction parallel to a WL according to an exemplary embodiment.
Figure 18B:
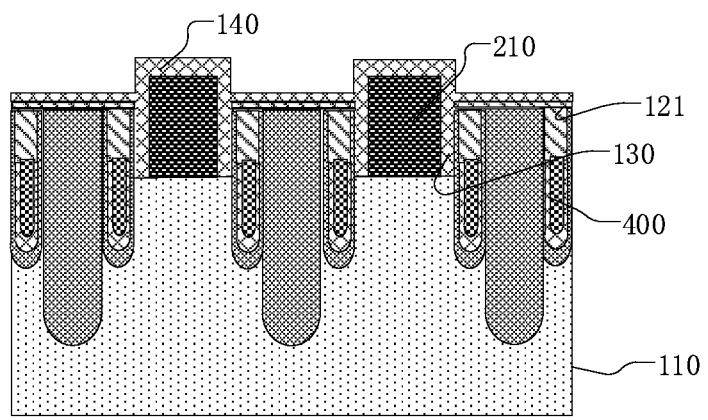
FIG. 18B is a sectional view of a third initial dielectric layer formed in a direction of a BL according to an exemplary embodiment.

FIG. 18A is a sectional view of the third initial dielectric layer formed in a direction parallel to a WL (referring to FIG. 3) according to the embodiment. FIG. 18B is a sectional view of the third initial dielectric layer formed in a direction of a BL (referring to FIG. 3) according to the embodiment.

As shown in FIG. 18A and FIG. 18B, the third initial dielectric layer 140 may be deposited by the ALD. A material of the third initial dielectric layer 140 includes one or more selected from the group consisting of conductive metal, conductive metal nitride, and conductive alloy. For example, the conductive metal may be titanium, tantalum, or tungsten. The material of the third initial dielectric layer 140 may be the same as or different from that of the second initial dielectric unit. In the embodiment, both the third initial dielectric layer 140 and the second initial dielectric unit 130 are made of the titanium nitride.

The third initial dielectric layer 140 covers the protrusive portion of the contact portion 210 protruding from the first dielectric layer 121, and is connected to the second initial dielectric unit 130 together such that all sidewall and top surface of the contact portion 210 are covered.

Figure 19A:
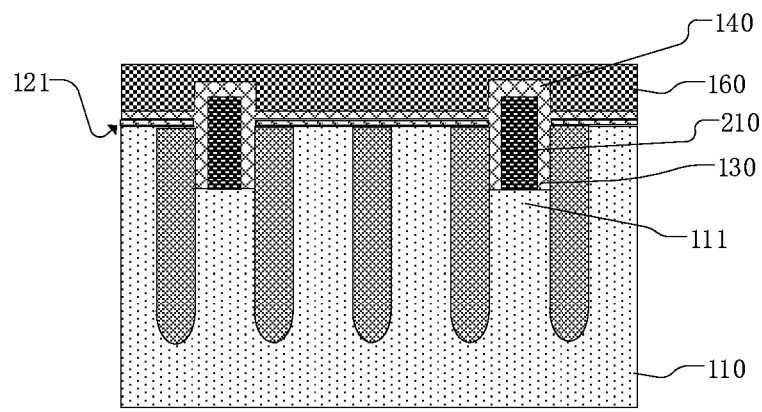
FIG. 19A is a sectional view of an initial conductive layer formed in a direction parallel to a WL according to an exemplary embodiment.
Figure 19B:
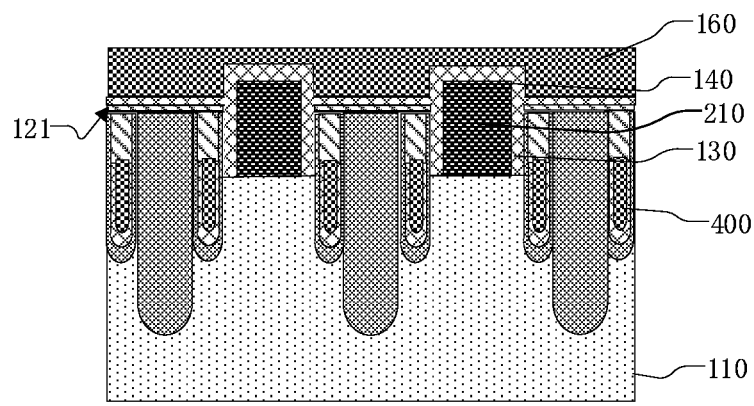
FIG. 19B is a sectional view of an initial conductive layer formed in a direction of a BL according to an exemplary embodiment.

FIG. 19A is a sectional view of an initial conductive layer formed in a direction parallel to a WL (referring to FIG. 3) according to the embodiment. FIG. 19B is a sectional view of an initial conductive layer formed in a direction of a BL (referring to FIG. 3) according to the embodiment. As shown in FIG. 19A and FIG. 19B, referring to FIG. 18A and FIG. 18B, a thickness of the third initial dielectric layer 140 is less than a height of the protrusive portion of the contact portion 210. Upon formation of the third initial dielectric layer 140, the top of the protrusive portion is still higher than the top of the third initial dielectric layer 140 on the first dielectric layer 121. Upon formation of the initial laminated structure 500, the top surface of the contact portion 210 and the third initial dielectric layer 140 thereon extend to the initial laminated structure 500 together. A contact area between the contact portion 210 and the initial laminated structure 500 is a sum of an area of the top surface of the contact portion 210 and an area of a sidewall of the contact portion extending into the initial laminated structure 500.

S160: Etch the initial laminated structure, the third initial dielectric layer and the second initial dielectric unit, where a remaining part of the initial laminated structure forms a laminated structure; the laminated structure includes a conductive layer; a remaining part of the second initial dielectric unit and a remaining part of the third initial dielectric layer are connected as a whole and form a barrier layer; and a part of the remaining part of the second initial dielectric unit and a part of the remaining part of the third initial dielectric layer that cover the contact portion form an extension portion of the barrier layer.

A material of the conductive layer 230 includes one or more selected from the group consisting of conductive metal, conductive metal nitride, and conductive alloy. For example, the material of the conductive metal may be titanium, tantalum, or tungsten. In the embodiment, the conductive layer 230 is made of the tungsten.

Figure 22A:
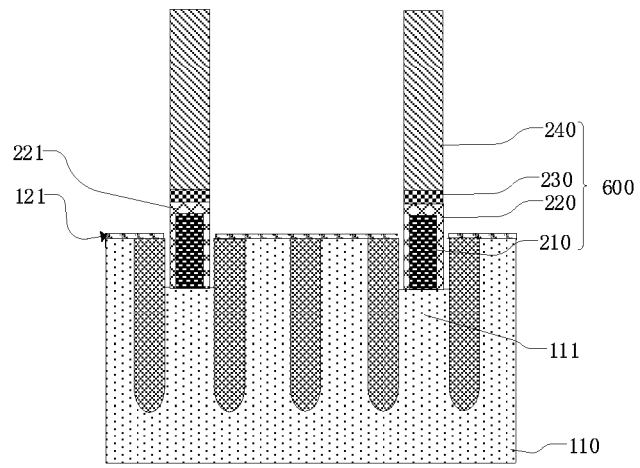
FIG. 22A is a sectional view of a laminated structure formed in a direction parallel to a WL according to an exemplary embodiment.
Figure 22B:
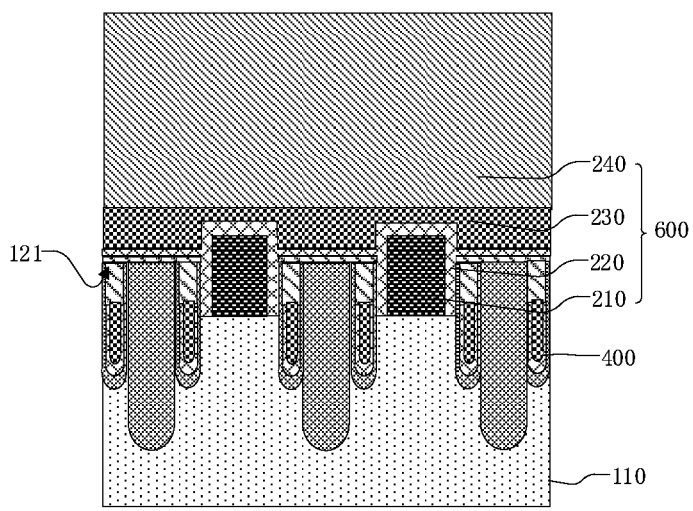
FIG. 22B is a sectional view of a laminated structure formed in a direction of a BL according to an exemplary embodiment.

FIG. 22A is a sectional view of the laminated structure formed in a direction parallel to a WL (referring to FIG. 3) according to the embodiment. FIG. 22B is a sectional view of the laminated structure formed in a direction of a BL (referring to FIG. 3) according to the embodiment.

As shown in FIG. 22A and FIG. 22B, the initial laminated structure 500, the third initial dielectric layer 140 and the second initial dielectric unit 130 are partially etched, until the first dielectric layer 121 is exposed or the substrate 110 is exposed, thereby forming the laminated structure 600. The laminated structure 600 is a linear structure extending along a second direction (the extension direction of the BL structure 200, namely the direction of the BL in FIG. 3). The second direction is perpendicular to a first direction in which the WL 400 extends (namely the direction of the WL in FIG. 3).

Any section of the laminated structure 600 in the first direction (namely the direction of the WL in FIG. 3) has a same width. Moreover, in the first direction (namely the direction of the WL in FIG. 3), a width of the laminated structure 600 is greater than that of the contact portion 210, and less than or equal to that of the initial contact hole 101, to ensure that two sides of the contact portion 210 are covered by the barrier layer 220.

S170: Form a fourth dielectric layer, the fourth dielectric layer covering the laminated structure and a part of the extension portion.

Figure 23A:
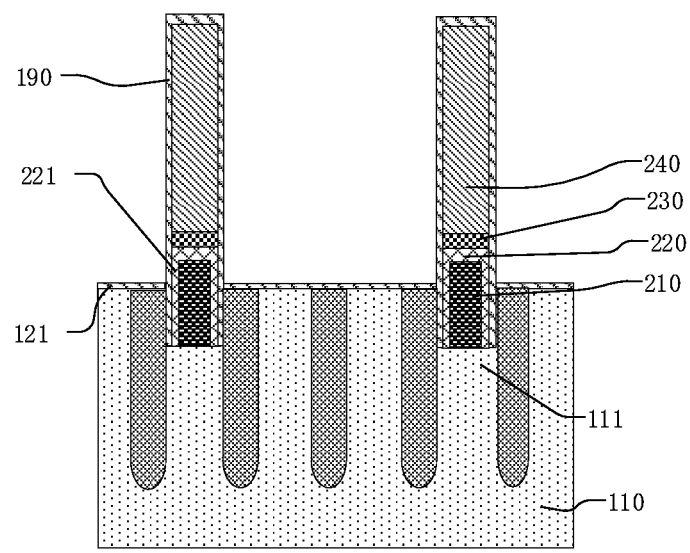
FIG. 23A is a sectional view of a fourth dielectric layer deposited in a direction parallel to a WL according to an exemplary embodiment.
Figure 23B:
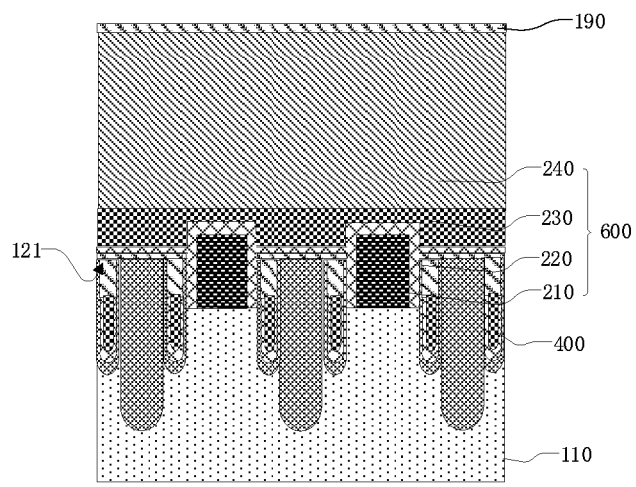
FIG. 23B is a sectional view of a fourth dielectric layer deposited in a is direction of a BL according to an exemplary embodiment.

FIG. 23A is a sectional view of the fourth dielectric layer formed in a direction parallel to a WL (referring to FIG. 3) according to the embodiment. FIG. 23B is a sectional view of the fourth dielectric layer formed in a direction of a BL (referring to FIG. 3) according to the embodiment. As shown in FIG. 23A and FIG. 23B, the fourth dielectric layer 190 may be deposited by the ALD. A material of the fourth dielectric layer 190 includes a material with desirable insulation performance such as silicon nitride or silicon oxynitride. In the embodiment, the fourth dielectric layer 190 is made of the silicon nitride.

According to the manufacturing method in the embodiment, a second initial dielectric unit covers a sidewall of an initial contact hole, and then a contact portion is formed. An outer sidewall of the contact portion is covered by the second initial dielectric unit. A third initial dielectric layer covering a top surface of the contact portion is formed.

Therefore, the outer sidewall and top surface of the contact portion are covered. During manufacture of the BL, the outer sidewall and top surface of the contact portion are prevented from being oxidized by air to increase the contact resistance. Moreover, a first initial dielectric layer is re-etched to form a first dielectric layer. The top surface of the contact portion is protruded from the first dielectric layer, such that the top surface of the contact portion extends into a conductive layer of a laminated structure. A contact area between the contact portion and the conductive layer is a sum of an area of the top surface of the contact portion and an area of a sidewall of the contact portion extending into the conductive layer. By preventing an increase in oxidation resistance of the contact portion during manufacture, the manufacturing method in the embodiment increases the contact area between the contact portion and the conductive layer, and reduces is the contact resistance between the contact portion and the conductive layer. With higher electrical connection efficiency between the contact portion and the conductive layer in the BL structure, the current is conducted more rapidly, and the electrical performance of the device can be improved.

Figure 5:
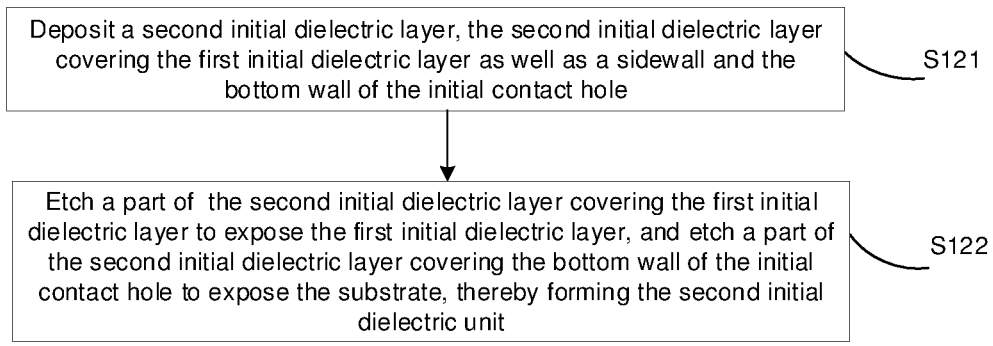
FIG. 5 is a flowchart for forming, in an initial contact hole, a second initial dielectric unit covering an outer sidewall of a contact portion in a method of manufacturing a BL structure according to an exemplary embodiment.

According to an exemplary embodiment, the embodiment is a description on the implementation of Step S120 in the foregoing embodiment. As shown in FIG. 5, FIG. 5 is a flowchart of Step S120 of forming, in an initial contact hole, a second initial dielectric unit covering an outer sidewall of a contact portion in a method of manufacturing a BL structure according to the embodiment.

The step of forming, in the initial contact hole, a second initial dielectric unit covering an outer sidewall of the contact portion includes:

S121: Deposit a second initial dielectric layer, the second initial dielectric layer covering the first initial dielectric layer as well as a sidewall and the bottom wall of the initial contact hole.

Figure 13A:
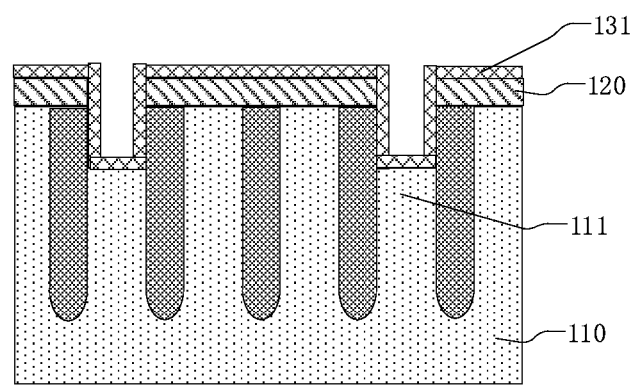
FIG. 13A is a sectional view of a second initial dielectric layer deposited in a direction parallel to a WL according to an exemplary embodiment.
Figure 13B:
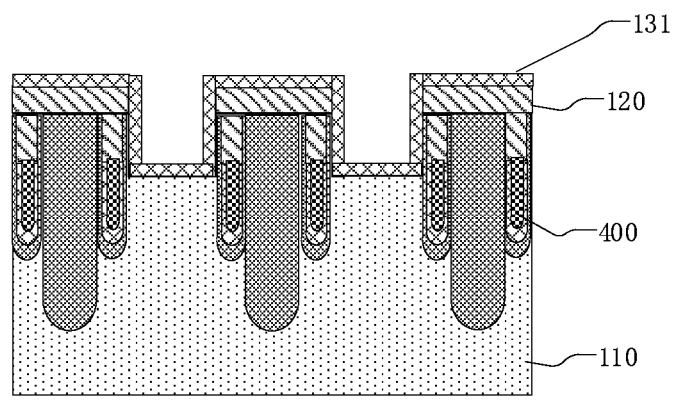
FIG. 13B is a sectional view of a second initial dielectric layer deposited in a direction of a BL according to an exemplary embodiment.

FIG. 13A is a sectional view of the second initial dielectric layer formed in a direction parallel to a WL (referring to FIG. 3) according to the embodiment. FIG. 13B is a sectional view of the second initial dielectric layer formed in a direction of a BL (referring to FIG. 3) according to the embodiment. As shown in FIG. 13A and FIG. 13B, referring to FIG. 12A and FIG. 12B, the second initial dielectric layer 131 may be deposited by the ALD. In the embodiment, the second initial dielectric layer 131 is made of the titanium nitride.

S122: Etch a part of the second initial dielectric layer covering the first initial dielectric layer to expose the first initial dielectric layer, and etch a part of the second initial dielectric layer covering the bottom wall of the initial contact hole to expose the substrate, thereby forming the second initial dielectric unit.

As shown in FIG. 14A and FIG. 14B, referring to FIG. 13A and FIG. 13B, the second initial dielectric layer 131 covering the top surface of the first initial dielectric layer 120 is removed by the dry or wet etching. The second initial dielectric layer 131 covering the bottom wall of the initial contact hole 101 is removed until the substrate 110 is exposed. The second initial dielectric layer 131 covering the sidewall of the initial contact hole 101 is retained to serve as the second initial dielectric unit 130. The second initial dielectric unit 130 and the exposed bottom wall of the initial contact hole 101 are enclosed into a contact hole 102.

In the embodiment, a sidewall of the contact hole 102 is enclosed by the second initial dielectric unit 130. Consequently, the bottom surface of the contact portion 210 contacts the substrate 110, and the sidewall of the contact portion 210 is connected to the second initial dielectric unit 130, which prevents direct exposure of the sidewall of the contact portion 210 in the air, prevents the sidewall of the contact portion 210 from being oxidized by the air during manufacture of the BL, and prevents the increase of the resistance due to oxidation of the contact portion 210.

Figure 6:
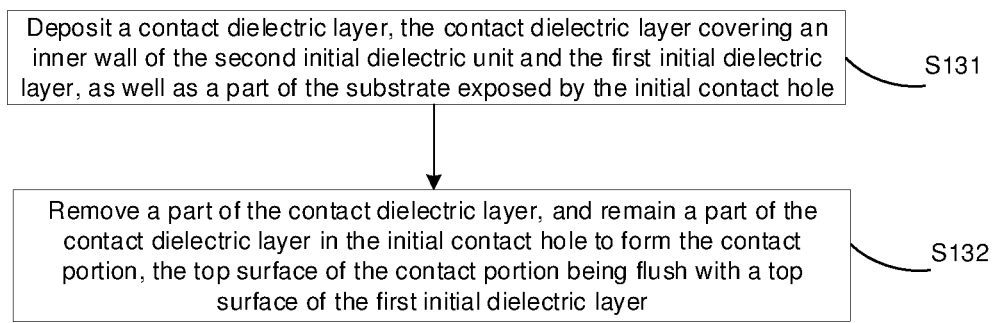
FIG. 6 is a flowchart for forming, in an initial contact hole, a contact portion in a method of manufacturing a BL structure according to an exemplary embodiment.

According to an exemplary embodiment, the embodiment is a description on the implementation of Step S130 in the foregoing embodiment. As shown in FIG. 6, FIG. 6 is a flowchart of Step S130 of forming, in the initial contact hole, a contact portion in a method of manufacturing a BL structure according to the embodiment.

The step of forming, in the initial contact hole, a contact portion includes:

S131: Deposit a contact dielectric layer, the contact dielectric layer covering an inner wall of the second initial dielectric unit and the first initial dielectric layer, as well as a part of the substrate exposed by the initial contact hole.

Figure 15A:
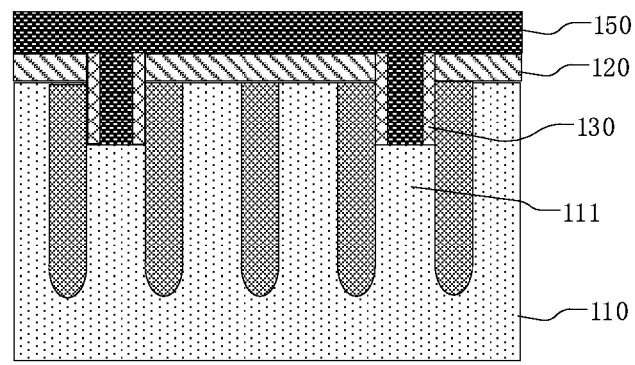
FIG. 15A is a sectional view of a contact dielectric layer deposited in a direction parallel to a WL according to an exemplary embodiment.
Figure 15B:
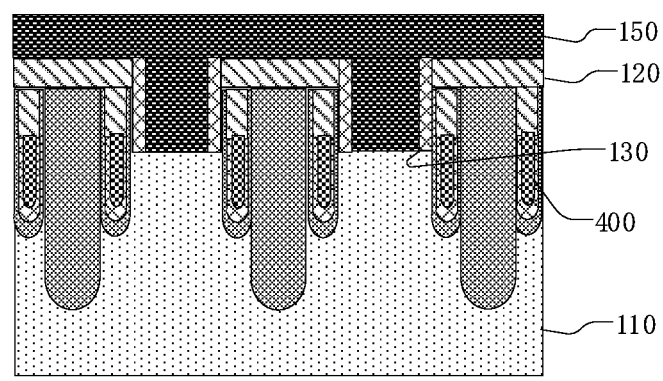
FIG. 15B is a sectional view of a contact dielectric layer deposited in a direction of a BL according to an exemplary embodiment.

FIG. 15A is a sectional view of the contact dielectric layer formed in a direction parallel to a WL (referring to FIG. 3) according to the embodiment. FIG. 15B is a sectional view of the contact dielectric layer formed in a direction of a BL (referring to FIG. 3) according to the embodiment. As shown in FIG. 15A and FIG. 15B, referring to FIG. 14A and FIG. 14B, the contact dielectric layer 150 may be deposited by the ALD. The contact dielectric layer 150 is filled in the contact hole 102 and covers the top surface of the first initial dielectric layer 120. In the embodiment, the contact dielectric layer 150 is made of the titanium is nitride.

S132: Remove a part of the contact dielectric layer, and remain a part of the contact dielectric layer in the initial contact hole to form the contact portion, the top surface of the contact portion being flush with a top surface of the first initial dielectric layer.

As shown in FIG. 16A and FIG. 16B, referring to FIG. 15A and FIG. 15B, the contact dielectric layer 150 on the first initial dielectric layer 120 is removed by the dry or wet etching, until the top surface of the first initial dielectric layer 120 is exposed to form the contact portion 210. The top surface of the contact portion 210 is flush with the top surface of the first initial dielectric layer 120.

In the exemplary embodiment, by removing the contact dielectric layer on the top surface of the first initial dielectric layer to form the contact portion, the top contact dielectric layer oxidized by the air can be removed, and thus the contact portion has the smaller resistance and the better conductivity.

Figure 7:
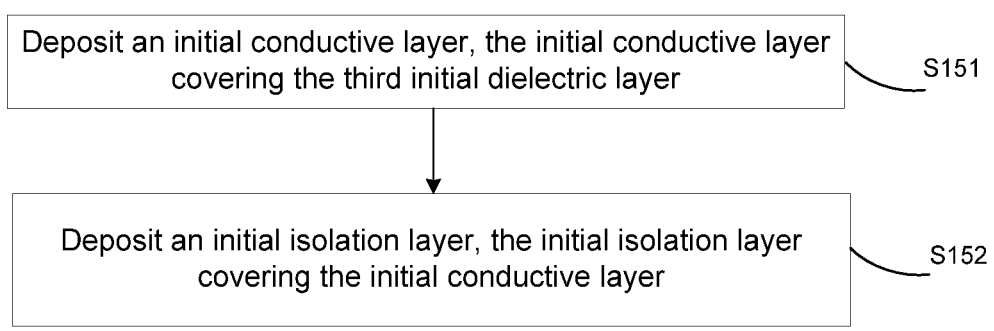
FIG. 7 is a flowchart for depositing an initial laminated structure in a method of manufacturing a BL structure according to an exemplary embodiment.

According to an exemplary embodiment, the embodiment is a description on the implementation of Step S150 in the foregoing embodiment. As shown in FIG. 7, FIG. 7 is a flowchart of Step S150 of depositing an initial laminated structure in a method of manufacturing a BL structure according to the embodiment.

The step of depositing an initial laminated structure includes:

S151: Deposit an initial conductive layer, the initial conductive layer covering the third initial dielectric layer.

As shown in FIG. 19A and FIG. 19B, referring to FIG. 18A and FIG. 18B, the initial conductive layer 160 may be deposited by the ALD. The initial conductive layer 160 covers the top surface of the first initial dielectric layer 120, the sidewall of the second initial dielectric unit 130, the top surface of the contact portion 210 and the top of the third initial dielectric layer 140. Exemplarily, the initial conductive layer 160 is made of the tungsten.

S152: Deposit an initial isolation layer, the initial isolation layer covering the initial conductive layer.

Figure 20A:
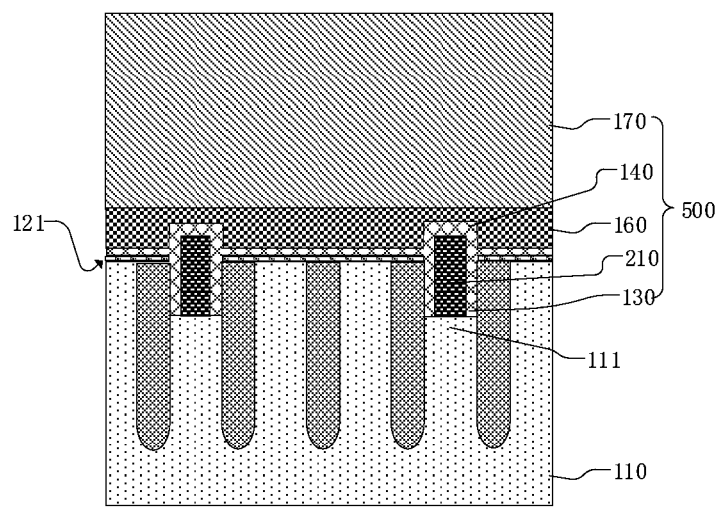
FIG. 20A is a sectional view of an initial isolation layer formed in a direction parallel to a WL according to an exemplary embodiment.
Figure 20B:
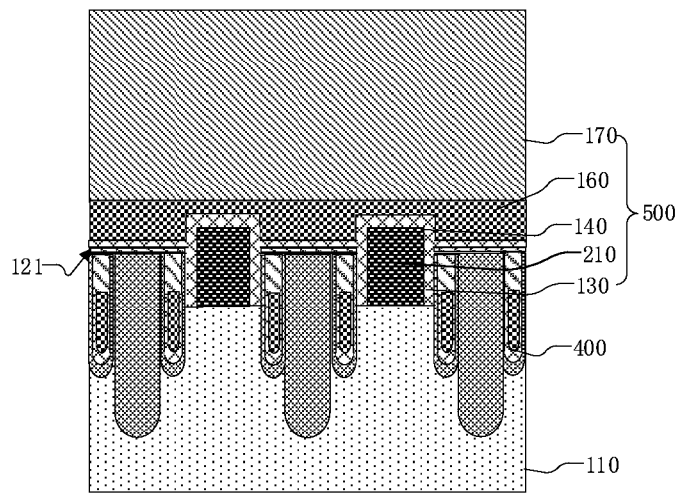
FIG. 20B is a sectional view of an initial isolation layer formed in a direction of a BL according to an exemplary embodiment.

FIG. 20A is a sectional view of the initial isolation layer formed in a direction parallel to a WL (referring to FIG. 3) according to the embodiment. FIG. 20B is a sectional view of the initial isolation layer formed in a direction of a BL (referring to FIG. 3) according to the embodiment. As shown in FIG. 20A and FIG. 20B, referring to FIG. 19A and FIG. 19B, the initial isolation layer 170 may be deposited by the ALD, and the initial isolation layer 170 covers the initial conductive layer 160. In the embodiment, the initial isolation layer 170 is made of the titanium nitride.

As shown in FIG. 20A and FIG. 20B, the initial laminated structure 500 includes a contact portion 210, the second initial dielectric unit 130, the third initial dielectric layer 140, the initial conductive layer 160, and the initial isolation layer 170 on the substrate.

In the embodiment, the deposited initial laminated structure includes the initial conductive layer and the initial isolation layer, such that the BL structure is firmer and more stable.

Figure 8:
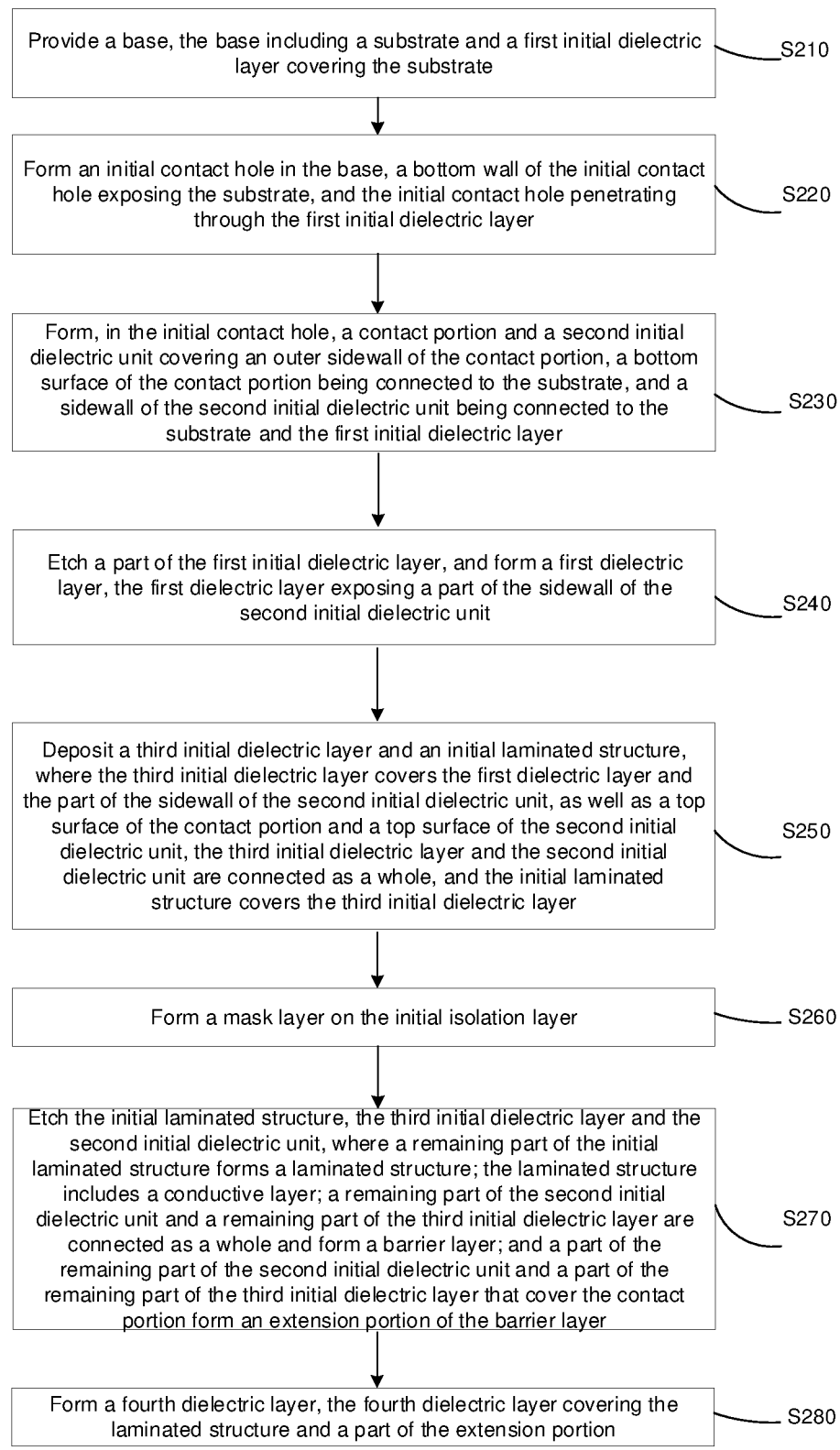
FIG. 8 is a flowchart of a method of manufacturing a BL structure according to an exemplary embodiment.

An exemplary embodiment of the present disclosure provides a method of manufacturing a BL structure. As shown in FIG. 8, FIG. 8 is a flowchart of a method of manufacturing a BL structure according to an exemplary embodiment. Step S210 to Step S250 in the embodiment are the same as Step S110 to Step S150 in the foregoing embodiment, Step S270 in the embodiment is the same as Step S160 in the foregoing embodiment, and Step S280 in the embodiment is the same as Step S170 in the foregoing embodiment.

As shown in FIG. 8, the embodiment differs from the foregoing embodiment in: after Step S250 of depositing a third initial dielectric layer and an initial laminated structure, and before Step S270 of etching the initial laminated structure, the third initial dielectric layer and the second initial dielectric unit, the method of manufacturing a BL structure in the embodiment further includes Step S260: Form a mask layer on the initial isolation layer.

Figure 21A:
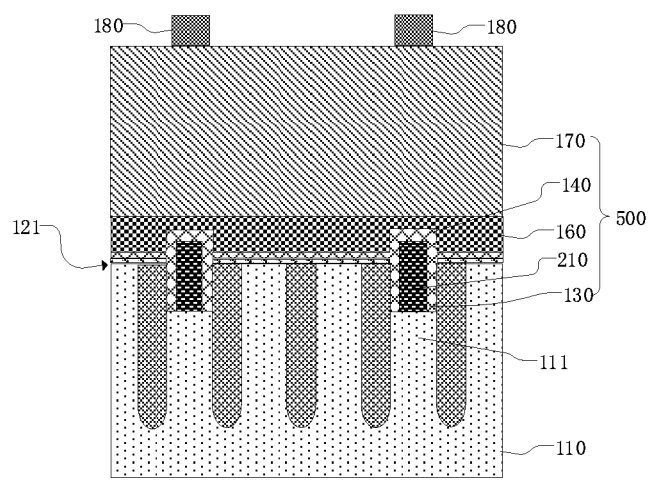
FIG. 21A is a sectional view of a mask layer formed in a direction parallel to a WL according to an exemplary embodiment.
Figure 21B:
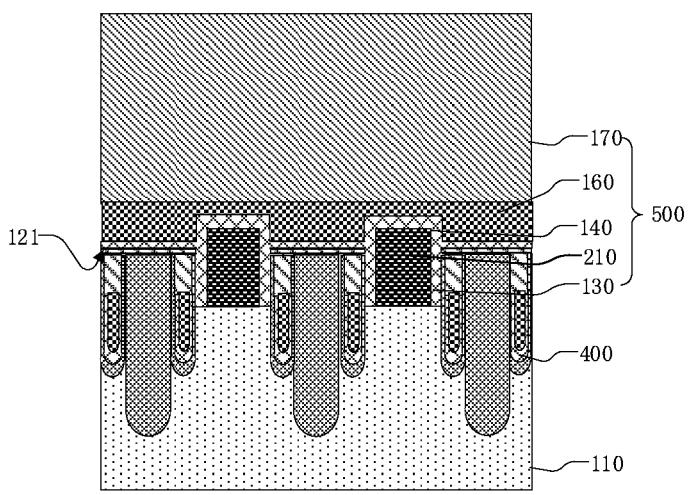
FIG. 21B is a sectional view of a mask layer formed in a direction of a BL according to an exemplary embodiment.

FIG. 21A is a sectional view of the mask layer formed in a direction parallel to a WL (referring to FIG. 3) according to the embodiment. FIG. 21B is a is sectional view of the mask layer formed in a direction of a BL (referring to FIG. 3) according to the embodiment. As shown in FIG. 21A and FIG. 21B, referring to FIG. 20A and FIG. 20B, the mask layer 180 is correspondingly provided on the initial isolation layer 170 on the contact portion 210. The mask layer 180 is of a strip structure extending along the second direction (the extension direction of the BL structure 200, namely the direction of the BL in FIG. 3). In the first direction (namely the direction of the WL in FIG. 3), a width of the mask layer 180 is greater than that of the contact portion 210, and less than or equal to that of the initial contact hole 101. Projection of the contact portion 210 on the substrate 110 falls within projection of the mask layer 180 on the substrate 100.

In the embodiment, the width of the mask layer 180 is less than that of the initial contact hole 101, and two sides of projection of the initial contact hole 101 on the substrate 100 extend from two sides of the projection of the mask layer 180 on the substrate 100.

In the embodiment, the width of the mask layer is limited within a range greater than the width of the contact portion and less than the width of the initial contact hole, and portions exceeding the mask layer are respectively retained at two sides of the initial contact hole, which ensures that the BL structure etched according to the mask layer in the embodiment has a desirable linear shape. Moreover, a part of the sidewall of the extension portion of the barrier layer can be exposed, such that the subsequently deposited fourth dielectric layer can cover the exposed sidewall of the extension portion to better protect the contact portion.

Figure 9:
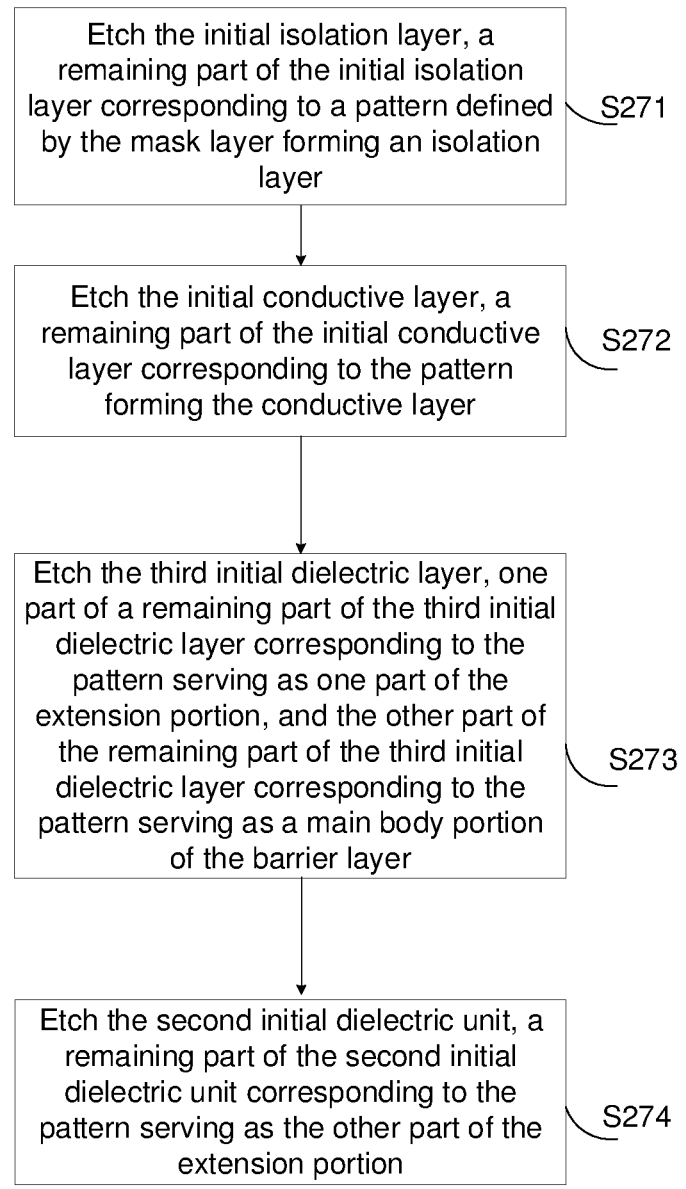
FIG. 9 is a flowchart for etching an initial laminated structure, a third initial dielectric layer and a second initial dielectric unit in a method of manufacturing a BL structure according to an exemplary embodiment.

According to an exemplary embodiment, the embodiment is a description on the implementation of Step S270 in the foregoing embodiment. As shown in FIG. 9, FIG. 9 is a flowchart of Step S270 of etching the initial laminated structure, the third initial dielectric layer and the second initial dielectric unit in a method of manufacturing a BL structure according to the embodiment.

The step of etching the initial laminated structure, the third initial dielectric layer and the second initial dielectric unit includes:

S271: Etch the initial isolation layer, a remaining part of the initial isolation layer corresponding to a pattern defined by the mask layer forming an isolation layer.

S272: Etch the initial conductive layer, a remaining part of the initial conductive layer corresponding to the pattern forming the conductive layer.

S273: Etch the third initial dielectric layer, one part of a remaining part of the third initial dielectric layer corresponding to the pattern serving as one part of the extension portion, and the other part of the remaining part of the third initial dielectric layer corresponding to the pattern serving as a main body portion of the barrier layer.

S274: Etch the second initial dielectric unit, a remaining part of the second initial dielectric unit corresponding to the pattern serving as the other part of the extension portion.

As shown in FIG. 22A and FIG. 22B, referring to FIG. 21A and FIG. 21B, the mask layer 180 is provided on the initial isolation layer 170. The initial isolation layer 170 not covered by the pattern defined by the mask layer 180 is removed by the dry or wet etching, and the remaining part of the initial isolation layer 170 forms the isolation layer 240. The pattern defined by the mask layer 180 is transferred to the initial conductive layer 160, the initial conductive layer 160 not covered by the pattern defined by the mask layer 180 is removed by the dry or wet etching, and the remaining part of the initial conductive layer 160 forms the conductive layer 230. The pattern defined by the mask layer 180 is transferred to the third initial dielectric layer 140, the third initial dielectric layer 140 not covered by the pattern defined by the mask layer 180 is removed by the dry or wet etching, and the remaining part of the third initial dielectric layer 140 serves as the main body portion 222 of the barrier layer 220 and one part of the extension portion 221. The pattern defined by the mask layer 180 is transferred to the second initial dielectric unit 130, the second initial dielectric unit 130 not covered by the pattern defined by the mask layer 180 is removed by the dry or wet etching until the substrate 110 is exposed, and the remaining is part of the second initial dielectric unit 130 serves as the other part of the extension portion 221 of the barrier layer 220.

In the exemplary embodiment, in Step S280, when the width of the laminated structure is less than that of the initial contact hole 101, after a part of the second initial dielectric unit 130 is removed, two sidewalls of the initial contact hole 101 are exposed. As shown in FIG. 22A and FIG. 22B, a protective space is formed at each of two sides of the extension portion 221 of the barrier layer 220. When the fourth dielectric layer 190 is deposited subsequently, a part of the fourth dielectric layer 190 covers the laminated structure 600 on the substrate 100 (referring to FIG. 1 and FIG. 2), and a part of the fourth dielectric layer 190 is filled in the protective space at each of the two sides of the extension portion 221 to form an insulating portion 310. The fourth dielectric layer 190 covering the laminated structure 600 on the substrate 100 and the insulating portion 310 at each of the two sides of the extension portion 221 jointly serve as an insulating structure 300. The insulating structure 300 and the first dielectric layer 121 are connected as a whole to protect the BL structure well.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the is above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the BL structure provided by the embodiment of the present disclosure, a barrier layer covers a top surface and an outer sidewall surface of a contact portion. The barrier layer protects the sidewall of the contact portion from being oxidized, thereby reducing the contact resistance of the BL.

The invention claimed is:

1. A bit line structure, provided on a substrate, and comprising:
    a contact portion, comprising a bottom surface connected to the substrate;
    a barrier layer, comprising an extension portion, the extension portion covering a top surface and an outer sidewall surface of the contact portion; and
    a conductive layer, covering a part of the barrier layer.

2. The bit line structure according to claim 1, wherein the contact portion comprises a first part and a second part, the first part is located in the substrate, and the second part is located on the substrate;
    the barrier layer further comprises a main body portion, and the second part of the contact portion penetrates through the main body portion and extends into the conductive layer; and
    the conductive layer covers the main body portion and a part of a surface of the extension portion.

3. The bit line structure according to claim 2, wherein the main body portion and the extension portion are connected as a whole.

4. The bit line structure according to claim 2, wherein the main body portion covers a first dielectric layer on the substrate; and
    the second part of the contact portion penetrates through the first dielectric layer.

5. The bit line structure according to claim 4, wherein along a circumferential direction of the extension portion, a first outer sidewall part of the extension portion contacts and is connected to the substrate, and a second outer sidewall part of the extension portion is provided with an insulating portion.

6. The bit line structure according to claim 5, wherein the insulating portion and the first dielectric layer are connected as a whole.

7. The bit line structure according to claim 5, wherein a plurality of parallel word lines are buried in the substrate, and the contact portion is provided between adjacent ones of the word lines.

8. The bit line structure according to claim 7, wherein a projection of the extension portion on the substrate is of a square; and with a plane parallel to the word lines and perpendicular to the substrate as a first section, the second outer sidewall part of the extension portion and the first section are perpendicular to each other.

9. The bit line structure according to claim 5, wherein a thickness of the first outer sidewall part of the extension portion is greater than a thickness of the second outer sidewall part of the extension portion.

10. A semiconductor structure, comprising the bit line structure according to claim 1.

* * * * *